(12) United States Patent
Matsumoto et al.

(10) Patent No.: US 6,989,073 B2
(45) Date of Patent: Jan. 24, 2006

(54) SEMICONDUCTOR DEVICE MANUFACTURING SYSTEM FOR ETCHING A SEMICONDUCTOR BY PLASMA DISCHARGE

(75) Inventors: Takanori Matsumoto, Yokkaichi (JP); Satoshi Shimonishi, Kawasaki (JP); Fumio Sato, Oita (JP); Masaki Narita, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 59 days.

(21) Appl. No.: 10/742,881

(22) Filed: Dec. 23, 2003

(65) Prior Publication Data

US 2004/0134610 A1 Jul. 15, 2004

Related U.S. Application Data

(62) Division of application No. 09/527,681, filed on Mar. 17, 2000, now Pat. No. 6,685,797.

(30) Foreign Application Priority Data

Mar. 19, 1999 (JP) ............................................ 11-076352

(51) Int. Cl.
*H01L 21/306* (2006.01)

(52) U.S. Cl. ................................................. 156/345.24
(58) Field of Classification Search ................ 355/67; 438/487; 156/345.24
See application file for complete search history.

(56) References Cited

U.S. PATENT DOCUMENTS

| | | | |
|---|---|---|---|
| 4,207,137 A | 6/1980 | Tretola et al. | |
| 4,602,981 A | 7/1986 | Chen et al. | |
| 5,314,603 A | 5/1994 | Sugiyama et al. | |
| 5,415,718 A | 5/1995 | Ohmi et al. | |
| 5,458,732 A | 10/1995 | Butler et al. | |
| 5,472,561 A | 12/1995 | Williams et al. | |
| 5,474,648 A | 12/1995 | Patrick et al. | |
| 5,553,396 A | 9/1996 | Kato et al. | |
| 5,576,629 A | 11/1996 | Turner et al. | |
| 5,643,364 A | 7/1997 | Zhao et al. | |
| 5,665,166 A | 9/1997 | Deguchi et al. | |
| 5,800,688 A | 9/1998 | Lantsman et al. | |
| 6,452,662 B2 * | 9/2002 | Mulkens | 355/67 |
| 6,528,397 B1 * | 3/2003 | Taketomi | 438/487 |

FOREIGN PATENT DOCUMENTS

| | | |
|---|---|---|
| JP | 60-206028 | 10/1985 |
| JP | 63-102333 | 5/1988 |
| JP | 4-130723 | 5/1992 |
| JP | 5-291188 | 11/1993 |
| JP | 9-219392 A | 8/1997 |
| JP | 9-219396 | 8/1997 |
| JP | 2000-100795 | 4/2000 |

OTHER PUBLICATIONS

Japan Patent Office Action dated Nov. 24, 2004, issued in counterpart application JP 11–076352.

* cited by examiner

*Primary Examiner*—John F. Niebling
*Assistant Examiner*—Andre' C. Stevenson
(74) *Attorney, Agent, or Firm*—Finnegan, Henderson, Farabow, Garrett & Dunner, L.L.P.

(57) ABSTRACT

A semiconductor device manufacturing system has a vacuum chamber which is provided with a cathode electrode for holding a substrate to be processed and into which a reactive gas for generating discharging plasma by the application of a high-frequency electric power is introduced, a measuring circuit which measures at least one of the impedance of a system including the plasma, the peak-to-peak voltage of a high-frequency signal applied to the plasma, and a self-bias voltage applied to the cathode electrode, and a sense circuit which compares the measured value from the measuring circuit with previously prepared data and senses the change of processing characteristics with time for the substrate in using the discharging plasma or the cleaning time of the inside of the vacuum chamber.

3 Claims, 10 Drawing Sheets

US 6,989,073 B2

SEMICONDUCTOR DEVICE MANUFACTURING SYSTEM FOR ETCHING A SEMICONDUCTOR BY PLASMA DISCHARGE

This is a division of application Ser. No. 09/527,681, filed Mar. 17, 2000 now U.S. Pat No. 6,685,797, which is incorporated herein by reference.

CROSS-REFERENCE TO RELATED APPLICATIONS

This application is based upon and claims the benefit of priority from the prior Japanese Patent Application No. 11-076352, filed Mar. 19, 1999, the entire contents of which are incorporated herein by reference.

BACKGROUND OF THE INVENTION

This invention relates to a semiconductor-device manufacturing system, and more particularly to a system for processing a semiconductor substrate by plasma discharge used in, for example, a reactive ion etching (RIE) system with a high-frequency power supply.

In a dry etching system used in the process of manufacturing semiconductor devices, a substrate on whose surface a given mask pattern has been formed is placed in a vacuum reactive chamber. A reactive gas is introduced into the vacuum reactive chamber and at the same time, discharging plasma is generated, thereby causing reactive ions to etch the substrate.

At that time, high-vapor-pressure reaction products are generally produced as a result of the reaction between the reactive ions and the etched layer. The reaction products are exhausted. Depending on the pressure in the vacuum chamber, the type of reactive gas, the flow rate, and the amount of energy of the reactive ions, the rate of reaction with the etched film and the types of reaction products differ.

In a system for processing a semiconductor substrate by plasma discharge, one means for clearly verifying the presence or absence of the change of processing conditions with time and the degree of the change with time, if any, is to process a substrate in such a manner that it has a shape with a high aspect ratio.

The shape with a high aspect ratio is, for example, a contact hole, a via hole, or a trench. As a typical example, problems encountered in a case where a conventional dry etching system is used in the process of forming trenches for trench capacitors in the memory cells of, for example, a DRAM will be explained.

FIGS. 1A and 1B are sectional views of a substrate in the process of forming a trench for trench capacitor.

As shown in FIG. 1A, a TEOS (Tetraethyl orthosilicate) film 12 is first formed on an Si substrate 11 to be processed. Then, patterning is done to form a mask pattern, thereby forming a sample of the substrate.

Next, after each lot processing of semiconductor substrates by a magnetron RIE system, a sample of the substrate as shown in FIG. 1A is placed in a vacuum reactive chamber. Reactive gases HBr, $O_2$, and $NF_3$ are introduced into the vacuum reactive chamber at flow rates of 100, 10, and 70 sccm, respectively. Then, plasma discharge is effected at a pressure of about 200 mTorr (about 26.6 Pa) with a high-frequency power supply output of about 1000 W, thereby causing reactive ions to etch the sample.

As a result of this, a trench 13 for trench capacitor is formed at the Si substrate 11 as shown in FIG. 1B. Here, θ is the taper angle at the top of the trench 13 and D is the diameter of the bottom of the trench.

FIG. 2 shows the relationship between the number of lots of substrates processed by a conventional RIE system and the diameter D (μm) of the trench bottom. The number of substrates processed in one lot is, for example, 24 to 25.

As seen from FIG. 2, as the number of substrates processed increases, the diameter D of the trench bottom decreases. The reason is that, as the number of substrates processed increases, the degree of the taper at the top of the trench decreases, making the taper angle θ smaller gradually.

The cause of this is not clear, but the following phenomenon is considered to be taking place.

In processing a trench for trench capacitor, $SiBr_x$, $SiBr_yO_z$, and $SiF_\alpha$ are mainly produced as reaction products. Although most of them are exhausted, part of them adhere to the relatively low-temperature parts of the vacuum chamber or decompose again into substances with lower vapor pressures and adhere to the inside of the vacuum chamber.

These deposits are estimated to be of the $SiO_2$ family. When the deposits build up to form a film, they are exposed to degassing or plasma, which causes the film to decompose again. As a result, the actual flow rate of each process gas in the atmosphere in the vacuum chamber differs from the set flow rate, preventing the desired shape and etching rate from being achieved.

As described above, because the diameter of the trench bottom is closely related to the condition of the deposited film on the inside of the vacuum chamber, a grasp of the condition of the deposited film would help determine the time the inside of the vacuum chamber should be cleaned. It is, however, impossible to grasp the condition of the inner surface of the vacuum chamber from the outside.

At present, the standard value of the diameter D of the trench bottom for trench capacitor is 0.1 μm. In this situation, the vacuum chamber is opened to atmosphere and cleaned manually every, for example, eight lots on the basis of the data in FIG. 2. However, it is not clear whether the method is the best.

As described above, with the conventional dry etching system for manufacturing semiconductor devices, it is impossible to externally grasp the condition of the inner surface and others of the vacuum chamber. For example, in processing a trench for trench capacitor, the change of the diameter of the trench bottom with time dependent on the number of substrates processed is impossible to grasp and therefore the suitable cleaning time of the inside of the vacuum chamber cannot be determined.

BRIEF SUMMARY OF THE INVENTION

It is, accordingly, an object of the prevention is to provide a semiconductor device manufacturing system which enables the change of the diameter of the trench bottom with time dependent on the number of substrates processed in processing a trench and the condition of the inner surface and others of the vacuum chamber to be grasped from the outside, making it possible to determine the suitable cleaning time of the inner surface of the vacuum chamber and control the processing of the shape of a substrate, which thereby suppresses the change with time.

According to a first aspect of the present invention, there is provided a semiconductor device manufacturing system comprising: a vacuum chamber provided with a cathode electrode for holding a substrate to be processed and into which a reactive gas for generating discharging plasma by the application of a high-frequency electric power is introduced; a high-frequency power supply connected to the cathode electrode, for applying a high-frequency electric power to the cathode electrode; a measuring circuit connected to the cathode electrode, for measuring at least one of the impedance of a system including the plasma, the peak-to-peak voltage of a high-frequency signal applied to the plasma, and a self-bias voltage applied to the cathode electrode; and a sense circuit for receiving the measured value from the measuring circuit, and for sensing the change of processing characteristics with time for the substrate in using the discharging plasma by comparing the measured value with previously prepared data.

According to a second aspect of the present invention, there is provided a semiconductor device manufacturing system comprising: a vacuum chamber provided with a cathode electrode for holding a substrate to be processed and into which a reactive gas for generating discharging plasma by the application of a high-frequency electric power is introduced; a high-frequency power supply connected to the cathode electrode, for applying a high-frequency electric power to the cathode electrode; a measuring circuit connected to the cathode electrode, for measuring at least one of the impedance of a system including the plasma, the peak-to-peak voltage of a high-frequency signal applied to the plasma, and a self-bias voltage applied to the cathode electrode; and a control circuit for receiving the measured value from the measuring circuit, for supplying an output based on the measured value to the high-frequency power supply, and for controlling the output of the high-frequency power supply in such a manner that the measured value of the measuring circuit is kept at a specific value.

According to a third aspect of the present invention, there is provided a semiconductor device manufacturing system comprising: a vacuum chamber provided with a cathode electrode for holding a substrate to be processed and a reactive gas intake and into which a reactive gas for generating discharging plasma by the application of a high-frequency electric power is introduced through the intake; a high-frequency power supply connected to the cathode electrode, for applying a high-frequency electric power to the cathode electrode; a valve provided at the intake in such a manner that the intake of the reactive gas introduced into the vacuum chamber is controlled; a measuring circuit connected to the cathode electrode for measuring at least one of the impedance of a system including the plasma, the peak-to-peak voltage of a high-frequency signal applied to the plasma, and a self-bias voltage applied to the cathode electrode; and a control circuit for receiving the measured value from the measuring circuit, for supplying an output based on the measured value to the valve, and for controlling the operation of the valve in such a manner that the measured value of the measuring circuit is kept at a specific value.

According to a fourth aspect of the present invention, there is provided a semiconductor device manufacturing system comprising: a vacuum chamber provided with a cathode electrode for holding a substrate to be processed and into which a reactive gas for generating discharging plasma by the application of a high-frequency electric power is introduced; a high-frequency power supply connected to the cathode electrode, for applying a high-frequency electric power to the cathode electrode; a measuring circuit for measuring at least one of the impedance of a system including the plasma, the peak-to-peak voltage of a high-frequency signal applied to the plasma, and a self-bias voltage applied to the cathode electrode; and a report circuit for receiving the measured value from the measuring circuit, for sensing that the measured value has departed from a preset range, and for reporting the cleaning time of the inside of the vacuum chamber.

According to a fifth aspect of the present invention, there is provided a semiconductor device manufacturing system comprising: a vacuum chamber provided with a cathode electrode for holding a substrate to be processed, a reactive gas intake, and a reactive gas outlet, and into which a reactive gas for generating discharging plasma by the application of a high-frequency electric power is introduced through the intake; a high-frequency power supply connected to the cathode electrode, for applying a high-frequency electric power to the cathode electrode; an electronic valve provided at the outlet in such a manner that the pressure in the vacuum chamber is adjusted; a measuring circuit connected to the cathode electrode for measuring at least one of the impedance of a system including the plasma, the peak-to-peak voltage of a high-frequency signal applied to the plasma, and a self-bias voltage applied to the cathode electrode; and a control circuit for receiving the measured value from the measuring circuit, for supplying an output based on the measured value to the valve, and for controlling the operation of the valve in such a manner that the measured value of the measuring circuit is kept at a specific value.

According to a sixth aspect of the present invention, there is provided a semiconductor device manufacturing system comprising: a vacuum chamber provided with a cathode electrode for holding a substrate to be processed and into which a reactive gas for generating discharging plasma by the application of a high-frequency electric power is introduced; a high-frequency power supply connected to the cathode electrode, for applying a high-frequency electric power to the cathode electrode; a cooling gas carrying path provided at the cathode electrode and into which a cooling gas is introduced to cool the substrate; an electronic valve provided at the cooling gas carrying path in such a manner that the pressure of the cooling gas introduced into the cooling gas carrying path is adjusted; a measuring circuit connected to the cathode electrode, for measuring at least one of the impedance of a system including the plasma, the peak-to-peak voltage of a high-frequency signal applied to the plasma, and a self-bias voltage applied to the cathode electrode; and a control circuit for receiving the measured value from the measuring circuit, for supplying an output based on the measured value, and for controlling the operation of the valve in such a manner that the measured value of the measuring circuit is kept at a specific value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained. The same reference symbols designate the corresponding parts throughout all the views and repetitious explanation will be avoided.

Figure 3:
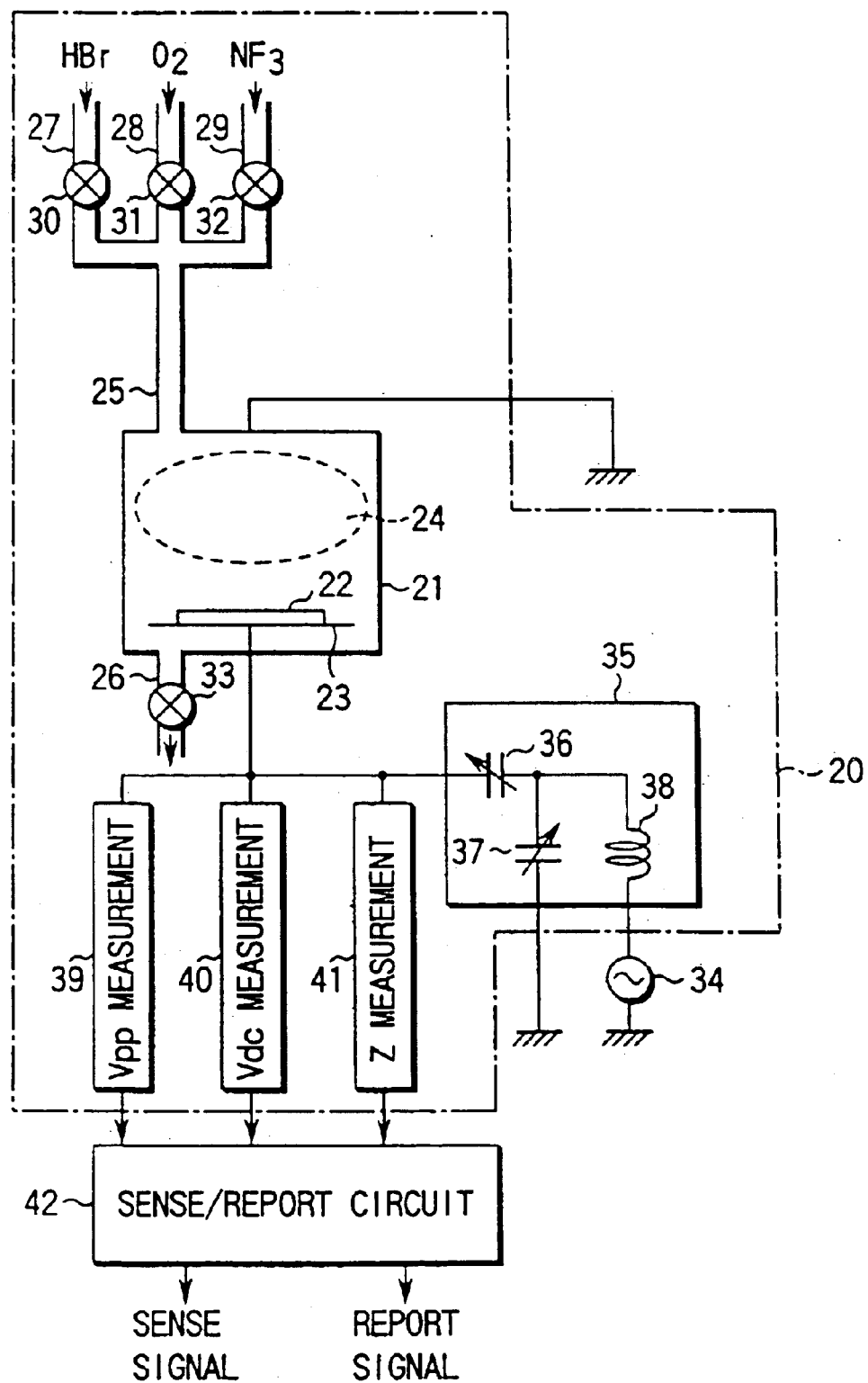
FIG. 3 is a schematic block diagram showing the configuration of an RIE system according to a first embodiment of the present invention and its peripheral circuit.

FIG. 3 shows a magnetron RIE system, a type of dry etching system according to a first embodiment of the present invention, and a control circuit for controlling the operation of the system.

In FIG. 3, numeral 20 indicates an RIE system. The RIE system 20 is provided with a vacuum reactive chamber 21. In the vacuum reactive chamber 21, a cathode electrode 23 for holding a substrate to be processed is provided. When a high-frequency power supply, explained later, applies a high-frequency electric power to the cathode electrode 23 and a reactive gas is introduced, discharging plasma 24 develops inside the vacuum reactive chamber 21. In the vacuum reactive chamber 21, a gas intake 25 for introducing a reactive gas and an outlet 26 for exhausting the gas from the vacuum reactive chamber 21 are provided. Three branch paths 27, 28, 29 are provided at the gas intake 25. When a mixed gas of three types of gases, for example, HBr, $O_2$, and $NF_3$, is used as etching gas, these three types of gases are carried through the three branch paths 27, 28, 29. In the branch paths 27, 28, 29, electronic valves 30, 31, 32 for adjusting the flow rate of the gases are provided respectively. At the outlet 26, there is provided an electronic valve 33 for controlling the amount of exhaust to adjust the pressure in the vacuum reactive chamber 21.

A high-frequency power supply 34 including, for example, a magnetron is connected to the cathode electrode 23. The output of the high-frequency power supply 34 is supplied to the cathode electrode 23. An impedance matching circuit (or matching controller) 35 is provided between the high-frequency power supply 34 and the cathode electrode 23. The matching controller 35 is for effecting the impedance matching between the output of the high-frequency power supply 34 and the load side.

The matching controller 35 is composed of, for example, two variable capacitors 36, 37, and an inductance 38. The values of the two variable capacitors 36, 37 are controlled automatically by an automatic control loop (not shown) in such a manner that the reflected power returning to the high-frequency power supply 34 always becomes the smallest, thereby achieving impedance matching.

Further connected to the cathode electrode 23 are a Vpp measuring circuit 39 for measuring the peak-to-peak voltage Vpp of a high-frequency signal applied to the plasma 24, a Vdc measuring circuit 40 for measuring a self-bias voltage Vdc applied to the cathode electrode 23, and an impedance (Z) measuring circuit 41 for measuring the impedance (Z) of a system including the plasma 24.

Then, the voltage Vpp measured at the Vpp measuring circuit 39, the voltage Vdc measured at the Vdc measuring circuit 40, and the impedance (Z) measured at the impedance measuring circuit 41 are inputted to a sense/report circuit 42. The sense/report circuit 42 has the function of comparing the outputs (or measurements) of the Vpp measuring circuit 39, the Vdc measuring circuit 40, and the impedance measuring circuit 41 with previously prepared data, sensing the change of processing characteristics with time for the substrate 22 to be processed, and determining and reporting the cleaning time of the inside of the vacuum chamber 21, and outputs a sense signal and a report signal.

The matching controller 35 is so controlled that the total of impedance as a physical quantity to be monitored is, for example, 50Ω in the part including the matching controller 34 and beyond that when viewed from the high-frequency power supply 34, that is, the system including the plasma on the vacuum reactive chamber 21 side. For example, if the impedance of the system including the plasma is 30Ω, the values of the two capacitors 36, 37 are adjusted by the automatic control loop so that the impedance of the matching controller 35 itself may be 20Ω. Since the impedance of the system including the plasma varies, depending on the etching condition of the substrate in etching the substrate or the change of the state in the vacuum reactive chamber 21, it is possible to control of the shape of the substrate and grasp the buildup of the deposited film on the inner surface of the vacuum reactive chamber 21 on the basis of the result of monitoring the impedance of the system including the plasma.

Figure 1A:
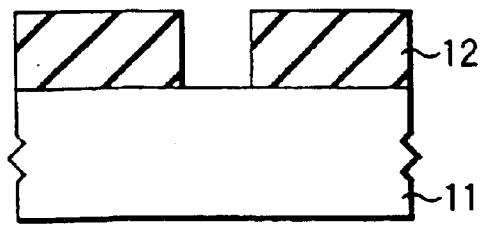
FIGS. 1A and 1B are sectional views of a substrate in the process of forming a trench for trench capacitor.
Figure 1B:
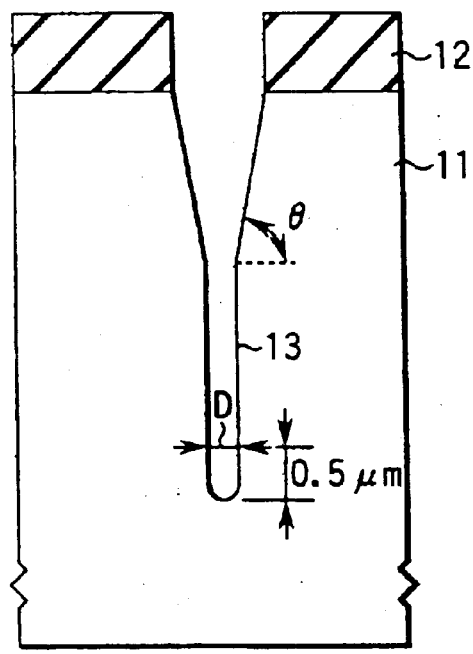
Figure 2:
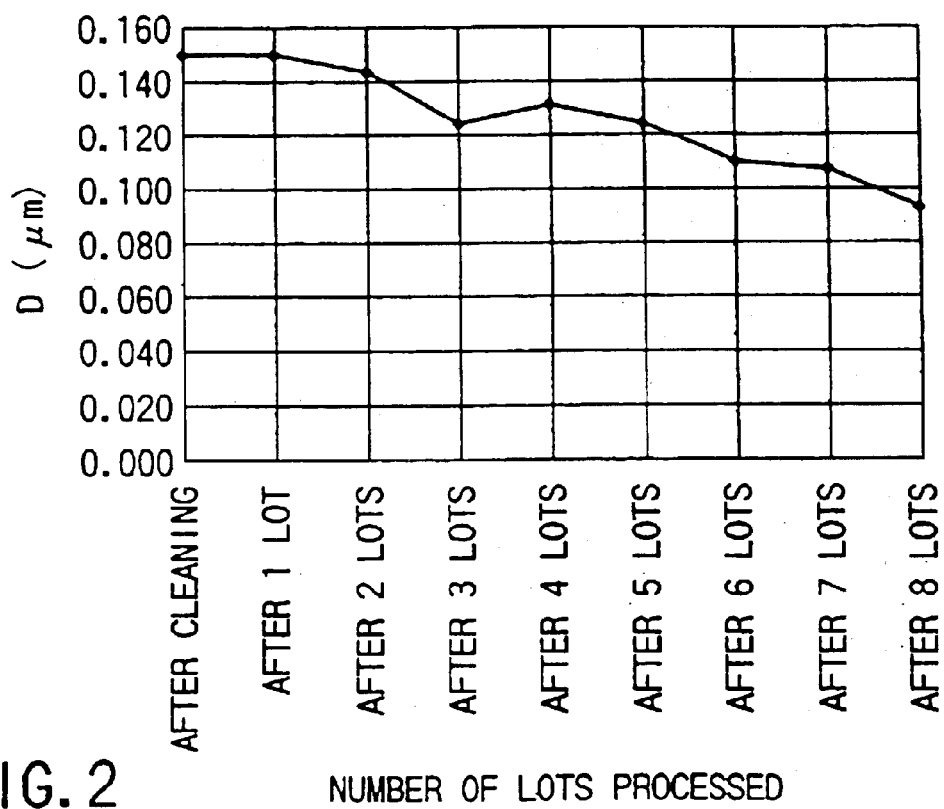
FIG. 2 shows the relationship between the number of substrates processed and the diameter of the trench bottom in a conventional dry etching system.

Ordinary lot processing was done using the RIE system in FIG. 3. After each lot process, a sample of the substrate as shown in FIG. 1A was placed in the vacuum reactive chamber 21. HBr gas, $O_2$ gas, and $NF_3$ gas were introduced as reactive gases into the vacuum reactive chamber at flow rates of about 100, 10, and 70 sccm, respectively. Discharging plasma 24 was generated at a pressure of about 200 mToor (about 26.6 Pa) in the vacuum reactive chamber with the high-frequency power supply 34 outputting about 1000 W, thereby causing reactive ions to etch the sample. As a result, a trench 13 for trench capacitor was formed in the Si substrate 11 as shown in FIG. 1B.

At that time, the relationship between the number of lots of substrates processed and the diameter D of the trench bottom in the RIE system was examined. In addition, the relationship between the number of lots processed and the peak-to-peak voltage Vpp of a high-frequency signal applied to the cathode electrode 23 in the vacuum reactive chamber was examined. The results of these are shown in FIG. 4A.

Examinations as described above were made several times using the same mask pattern under the same etching conditions. FIG. 4B shows the result of examining the relationship between the peak-to-peak voltage Vpp of the high-frequency signal at that time and the diameter D of the trench bottom.

Figure 4A:
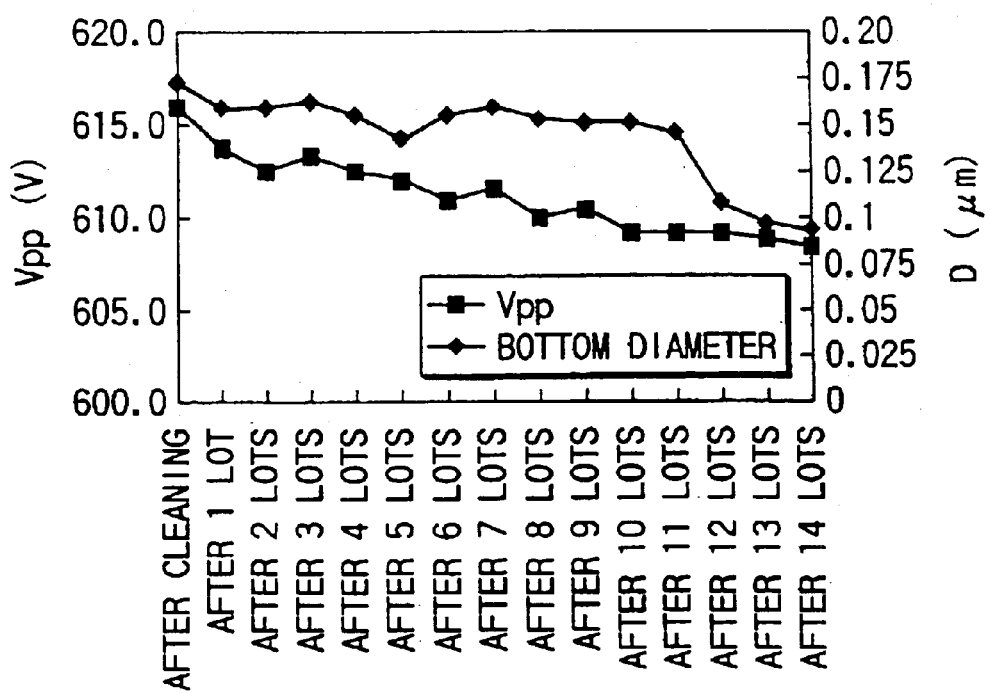
FIG. 4A shows the relationship between the number of lots of substrates processed, the peak-to-peak voltage of a high-frequency signal, and the diameter of the trench bottom in the system of FIG. 3.
Figure 4B:
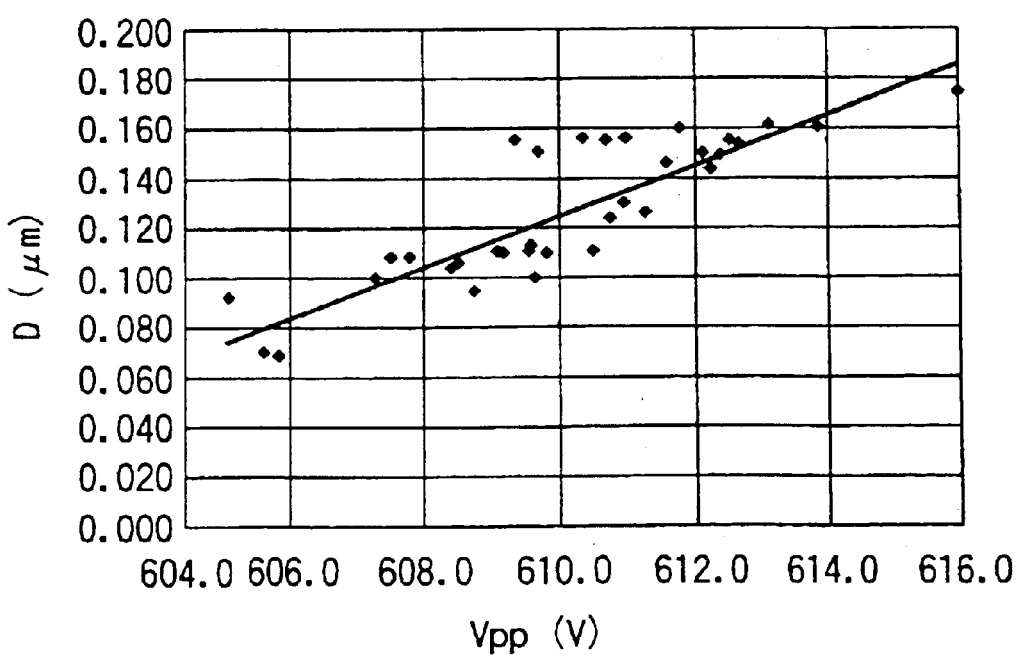
FIG. 4B shows the relationship between the peak-to-peak voltage of the high-frequency signal and the diameter of the trench bottom in the system of FIG. 3.

It can be seen from FIGS. 4A and 4B that there is a correlation between the diameter D of the trench bottom and the peak-to-peak voltage Vpp of the high-frequency signal and the diameter D of the trench bottom can be almost determined by measuring the Vpp with the Vpp measuring circuit 39.

As described above, the reason why the diameter D of the trench bottom correlates with the peak-to-peak voltage Vpp of the high-frequency signal is not clear, but can be considered as follows.

When the shape of the trench has got thinner for some reason, the opening area of the Si substrate to be etched decreases. Because the main reaction products are estimated to be $SiBr_x$, $SiBr_yO_z$, $SiF_a$, and the like, as the amount of Si in the substance to be etched decreases, the amount of reaction products decreases accordingly. As a result, the frequency of collision between ions and reaction products decreases, resulting in a decrease in the impedance of the system including the plasma 24. If the output of the high-frequency power supply is W, the equation $W=Vpp^2/Z$ holds. In this case, because W is constant (in this embodiment, about 1000 W), Vpp is also expected to decrease.

Between the self-bias voltage Vdc applied to the cathode electrode 23 holding the substrate 22 and the peak-to-peak voltage Vpp of the high-frequency signal, the fact that Vdc is almost equal to Vpp/2 is generally true. As a result, it is easily estimated that the diameter D of the trench bottom is determined by measuring the Vdc with the Vdc measuring circuit 40 as is the Vpp.

With the RIE system of the first embodiment, there is provided the sense/report circuit 42 that compares the outputs (measurements) of the measuring circuits 39, 40, and 41 with the previously prepared data and senses and reports the change of processing characteristics with time for a substrate to be processed or the cleaning time of the inside of the vacuum reactive chamber. The sense signal makes it possible to externally grasp the change of the diameter of the trench bottom dependent on the number of substrates processed in processing a trench for trench capacitor. Furthermore, the report signal enables the condition and the like of the inner surface of the vacuum reactive chamber to be grasped indirectly from the outside, which makes it possible to determine the suitable cleaning time of the inside of the vacuum reactive chamber.

Figure 5:
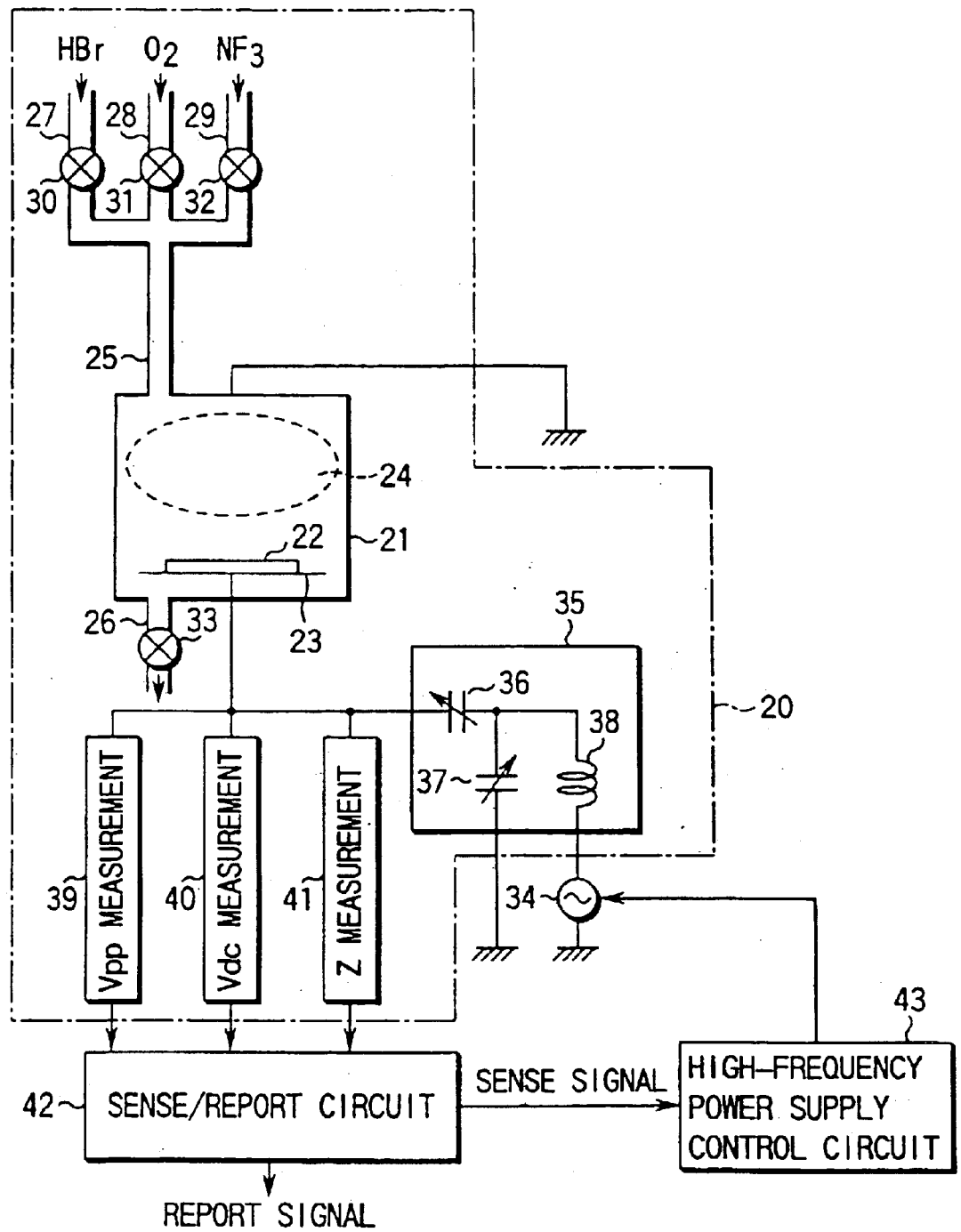
FIG. 5 is a schematic block diagram showing the configuration of an RIE system according to a second embodiment of the present invention and its peripheral circuit.

FIG. 5 shows a magnetron RIE system, a type of dry etching system according to a second embodiment of the present invention, and a control circuit for controlling the operation of the system.

The RIE system of the second embodiment differs from that of FIG. 3 in an additional high-frequency power supply control circuit 43 that receives the sense signal outputted from the sense/report circuit 42 and controls the output of the high-frequency power supply 34.

In the RIE system of the second embodiment, on the basis of the sense signal outputted according to one or two or more of the value of Vpp measured by the Vpp measuring circuit 39, the value of Vdc measured by the Vdc measuring circuit 40, and the value of the impedance measured by the Z measuring circuit 41, the high-frequency power supply control circuit 43 is controlled. In addition, the output of the high-frequency power supply 34 is controlled on the basis of the output of the high-frequency power supply control circuit 43. In this way, the impedance Z, the peak-to-peak voltage Vpp of the high-frequency electric power, and the self-bias voltage Vdc are controlled. Then, shape control in processing a substrate can be performed by controlling the output of the high-frequency power supply 34 in such a manner that each of the measured values is kept at a desired constant value.

After each lot processing of semiconductor substrates was carried out using the RIE system of FIG. 5, a sample of the substrate as shown in FIG. 1A was placed in the vacuum reactive chamber. HBr gas, $O_2$ gas, and $NF_3$ gas were introduced as reactive gases through the branch paths 27, 28, 29 into the vacuum reactive chamber at flow rates of about 100, 10, and 70 sccm, respectively. Discharging plasma 24 was generated at a pressure of about 200 mToor (about 26.6 Pa) in the vacuum reactive chamber with the output of the high-frequency power supply 34 being applied to the cathode electrode 23, thereby causing reactive ions to etch the sample.

At that time, dry etching was done changing the output (RF-Power) (W) of the high-frequency power supply 34, thereby examining how the peak-to-peak voltage Vpp of the high-frequency signal changed. At the same time, how the taper angle θ at the top of the trench as shown in FIG. 1B changed was also examined. The results are shown in FIGS. 6A and 6B.

Figure 6A:
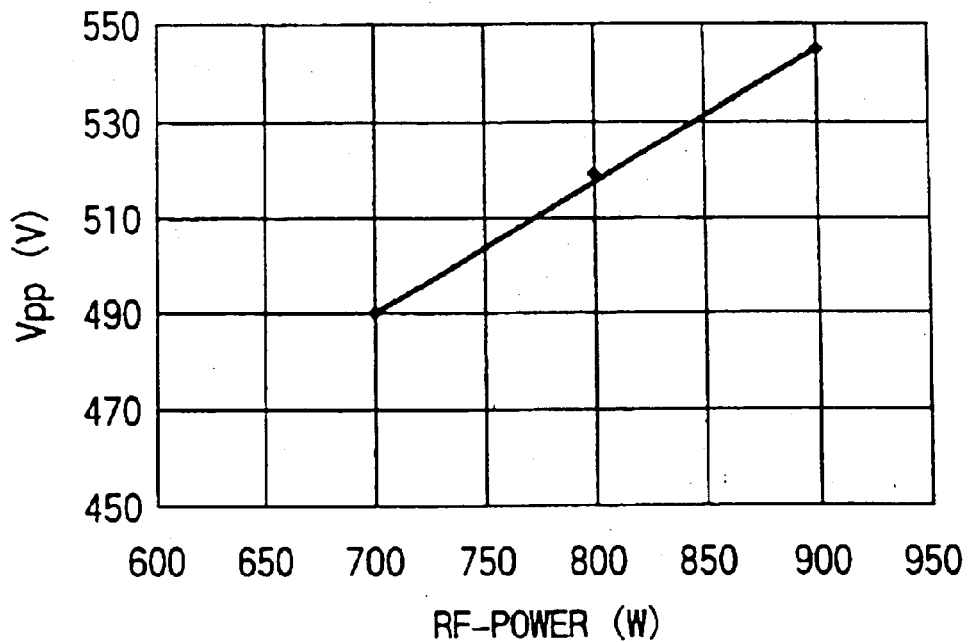
FIG. 6A shows the relationship between the output of a high-frequency power supply and the peak-to-peak voltage of the high-frequency signal in the system of FIG. 5.
Figure 6B:
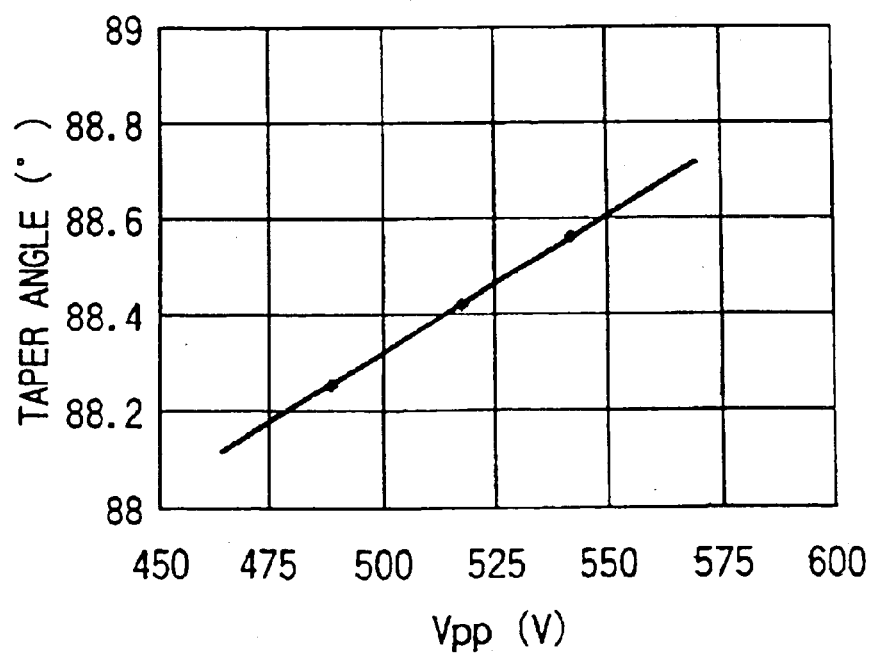
FIG. 6B shows the relationship between the peak-to-peak voltage of the high-frequency signal and the taper angle θ at the top of the trench in the system of FIG. 5.

It can be seen from FIGS. 6A and 6B that the output of the high-frequency power supply 34 and the peak-to-peak voltage Vpp of the high-frequency signal and the taper angle θ of the trench have one-to-one correspondence and therefore the taper angle θ can be controlled by the high-frequency output.

The reason is not clear. The equation $W=Vpp^2/Z$ generally holds. When the amount of reaction products generated is almost constant, Z is almost constant. Therefore, Vpp is proportional to W and the value of Vpp is estimated to be determined.

Furthermore, part of the reaction products adhere to the sidewall of the trench to make a sidewall protective film. The taper angle θ at the top of the trench is controlled by the amount of the sidewall protective film. As the sidewall protective film gets thicker, the taper angle θ becomes smaller.

In addition, since Vdc is generally equal to Vpp/2, an increase in Vpp increases Vdc, which increases the energy at which reactive ions arrive at the substrate. As a result, the sidewall protective film inside the trench is estimated to be scraped away, making the taper stand more straight.

With the RIE system of the second embodiment, the value of Vpp is measured by the Vpp measuring circuit 39, the value of Vdc is measured by the Vdc measuring circuit 40, and the value of Z is measured by the Z measuring circuit 41. The high-frequency power supply control circuit 43 is controlled on the basis of the sense signal outputted from the sense/report circuit 42 according to the result of the measurements. The output of the high-frequency power supply 34 is controlled to an arbitrary value in such a manner that the measured value of Vpp, Vdc, or Z is kept at a specific set value. Controlling the high-frequency power supply circuit 43 and the output of the high-frequency power supply 34 this way enables the shape of the trench to be controlled.

Figure 7:
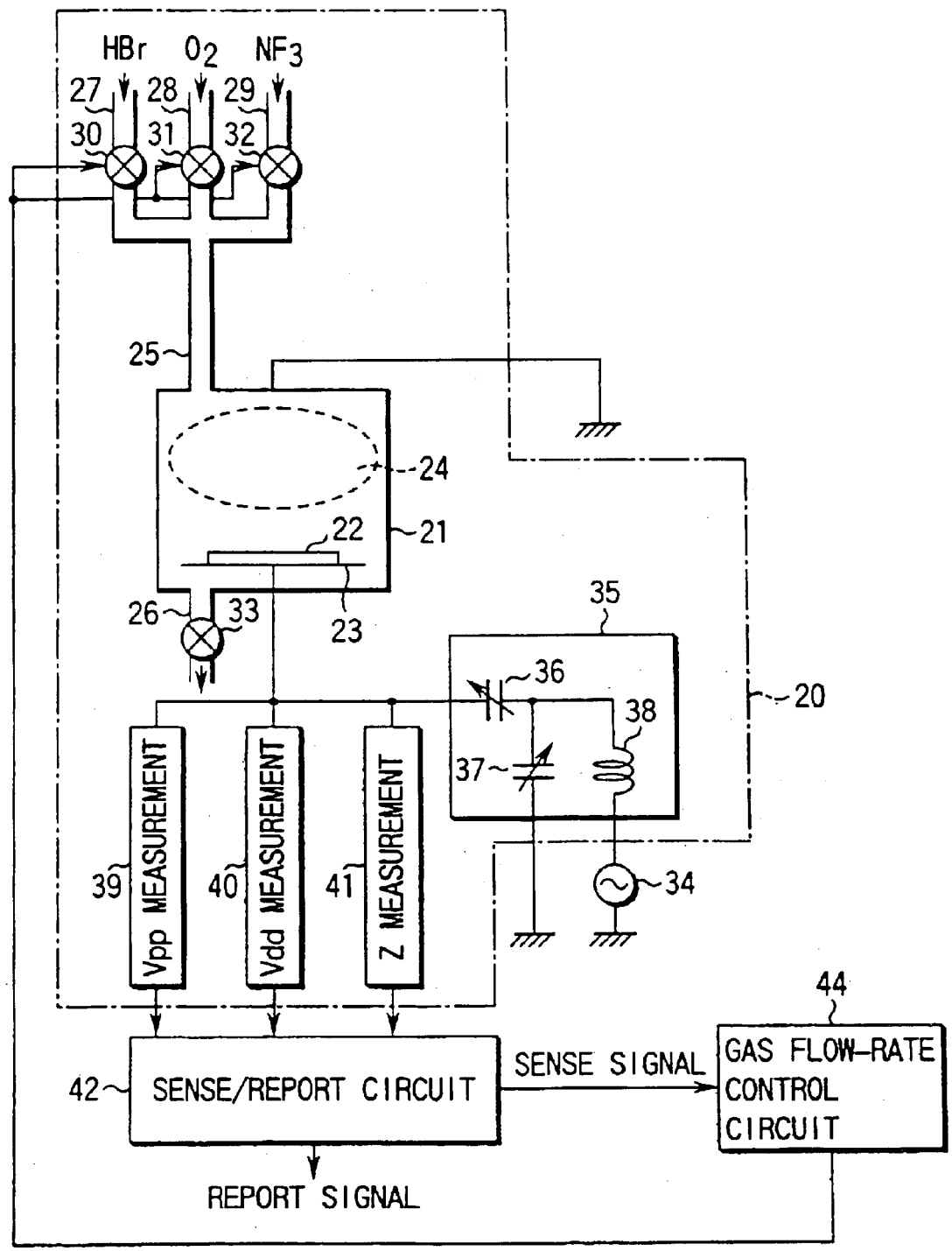
FIG. 7 is a schematic block diagram showing the configuration of an RIE system according to a third embodiment of the present invention and its peripheral circuit.

FIG. 7 shows a magnetron RIE system, a type of dry etching system according to a third embodiment of the present invention, and a control circuit for controlling the operation of the system.

The RIE system of the third embodiment differs from that of FIG. 1 in an additional gas flow-rate control circuit 44 that receives the sense signal outputted from the sense/report circuit 42 and controls the flow rate of each of the gases by controlling the opening and closing of the electronic valves 30, 31, 32. The output of the gas flow-rate control circuit 44 is supplied to each of the electronic valves 30, 31, 32.

In the RIE system constructed as described above, after each lot processing of semiconductor substrates, a sample of the substrate as shown in FIG. 1A was placed in the vacuum reactive chamber. HBr gas, $O_2$ gas, and $NF_3$ gas were introduced as reactive gases through the branch paths 27, 28, 29 into the vacuum reactive chamber. Discharging plasma 24 was generated at a pressure of about 200 mToor (about 26.6 Pa) in the vacuum reactive chamber with the output (RF-Power) of the high-frequency power supply 34 being applied to the cathode electrode 23, thereby causing reactive ions to etch the sample.

At that time, dry etching was done by introducing HBr gas and $NF_3$ gas at flow rates of about 100 and 70 sccm respectively, and changing a flow rate of $O_2$ gas, thereby examining how the peak-to-peak voltage Vpp of the high-frequency signal changed. At the same time, how the taper angle θ at the top of the trench as shown in FIG. 1B changed was also examined. The results are shown in FIGS. 8A and 8B.

Figure 8A:
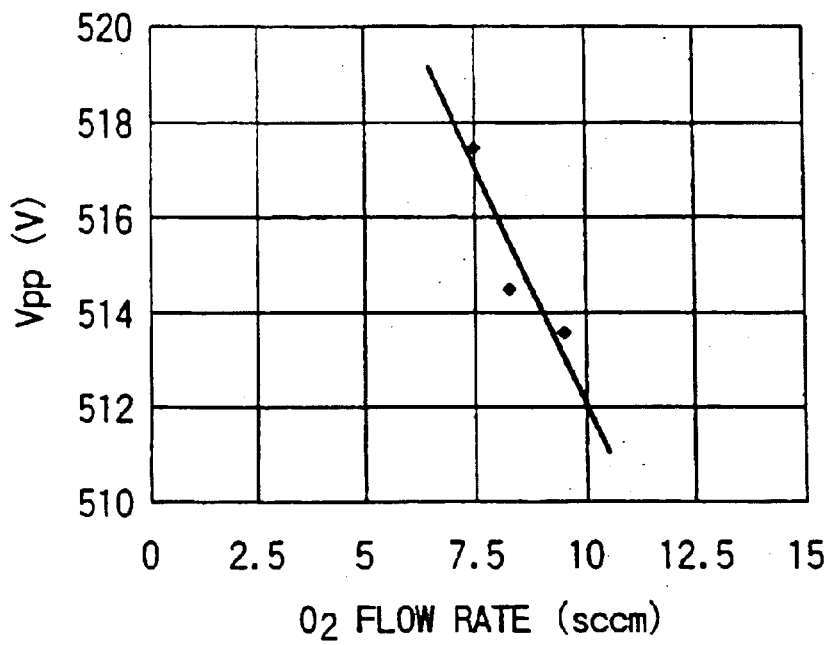
FIG. 8A shows the relationship between the flow rate of a reactive gas and the peak-to-peak voltage of a high-frequency signal in the system of FIG. 7.
Figure 8B:
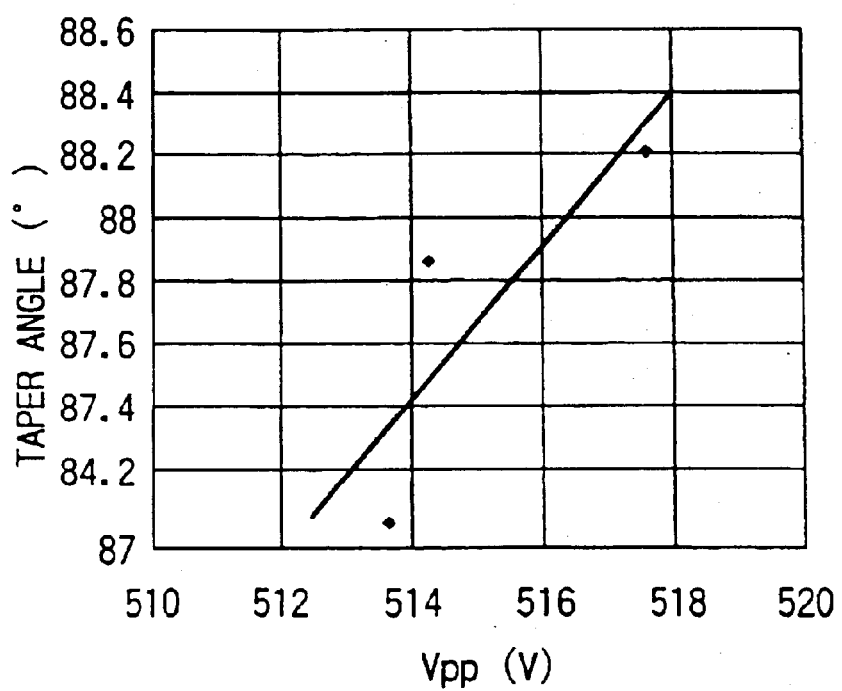
FIG. 8B shows the relationship between the peak-to-peak voltage of the high-frequency signal and the taper angle at the top of the trench in the system of FIG. 7.

It can be seen from FIGS. 8A and 8B that the flow rate of the $O_2$ gas and the peak-to-peak voltage Vpp of the high-frequency signal and the taper angle θ of the trench have one-to-one correspondence and therefore control can be performed on the basis of the flow rate of the $O_2$ gas.

The reason is not clear. The equation $W=Vpp^2/Z$ generally holds. An increase in the flow rate of the $O_2$ gas increases the amount of reaction products of the $SiBr_yO_2$ family generated, which increases the impedance Z. In this case, therefore, W is almost constant. From this, the value of Vpp can be considered to have decreased.

Furthermore, since the magnitude of the impedance Z depends on the amount of reaction products, a similar effect is easily estimated to be produced in a case where a process gas including a bromine-containing gas, such as HBr containing Br and F composing reaction products and a fluorine-containing gas, such as $NF_3$, is used.

With the RIE system of the third embodiment, the value of Vpp is measured by the Vpp measuring circuit 39, the value of Vdc is measured by the Vdc measuring circuit 40, and the value of Z is measured by the Z measuring circuit 41. On the basis of the results of the measurements, the gas flow-rate control circuit 44 is controlled and the valves 30 to 32, particularly the valve 31 for controlling the flow rate of $O_2$ gas, are controlled. In this way, the flow rate of each process gas is controlled to an arbitrary value in such a manner that the measured value of Vpp, Vdc, or Z is kept at a specific set value, which enables the shape of the trench to be controlled.

Figure 9:
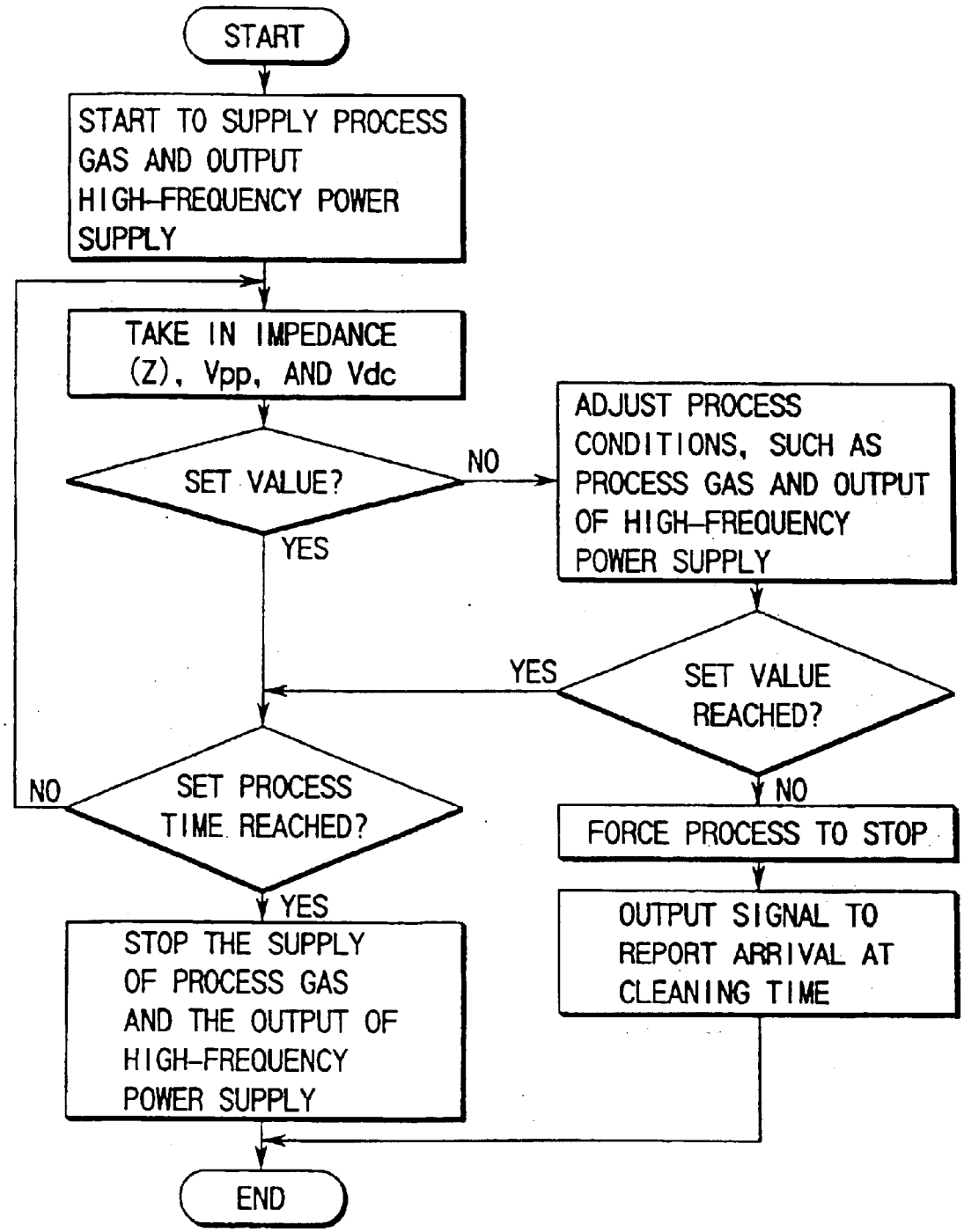
FIG. 9 is a flowchart to help explain a method of manufacturing semiconductor devices using the system of FIG. 5 or 7.

Next, a method of processing a substrate using the RIE system in FIG. 5 or 7 will be explained briefly by reference to a flowchart in FIG. 9.

When the processing of a substrate is started, the supply of each process gas and the output of the high-frequency power supply are first started.

At least one of the measured values of the impedance Z of the part including the system and plasma 24, the peak-to-peak voltage Vpp of the high-frequency signal applied to the plasma 24, and the self-bias voltage Vdc developing at the cathode electrode 23 is taken in by the sense/report circuit 42.

Then, it is judged whether those measured values are equal to the previously set values. The judgment is made at the sense/report circuit 42. If the measured value is equal to the set value, the supply of the process gas and the output of the high-frequency power supply are stopped at the time when the set process end time has been reached, which completes the process.

When the set process end time has not been reached, the measured value is taken in again by the sense/report circuit 42, which judges whether the measured value is equal to the set value.

If the measured value is different from the set value, the process condition, such as the process gas or the output of the high-frequency power supply, is adjusted in real time. Then, it is judged whether a measured value equal to the set value has been obtained. At this time. If a measured value equal to the set value has not be obtained, a process stop signal is transmitted to the high-frequency power supply 34 or valves 30 to 32, which forces the process to end. At the same time, the sense/report circuit 42 outputs the report signal that reports that the cleaning time has been reached.

Monitoring the impedance Z, peak voltage Vpp, and self-bias voltage Vdc makes it possible to clearly grasp, from the outside of the vacuum chamber, the change of substrate processing characteristic in the vacuum chamber with time and the cleaning time of the inside of the vacuum chamber. In addition, keeping the result of monitoring at an arbitrary value enables shape control of processing, which makes it possible to suppress the change with time.

Figure 10:
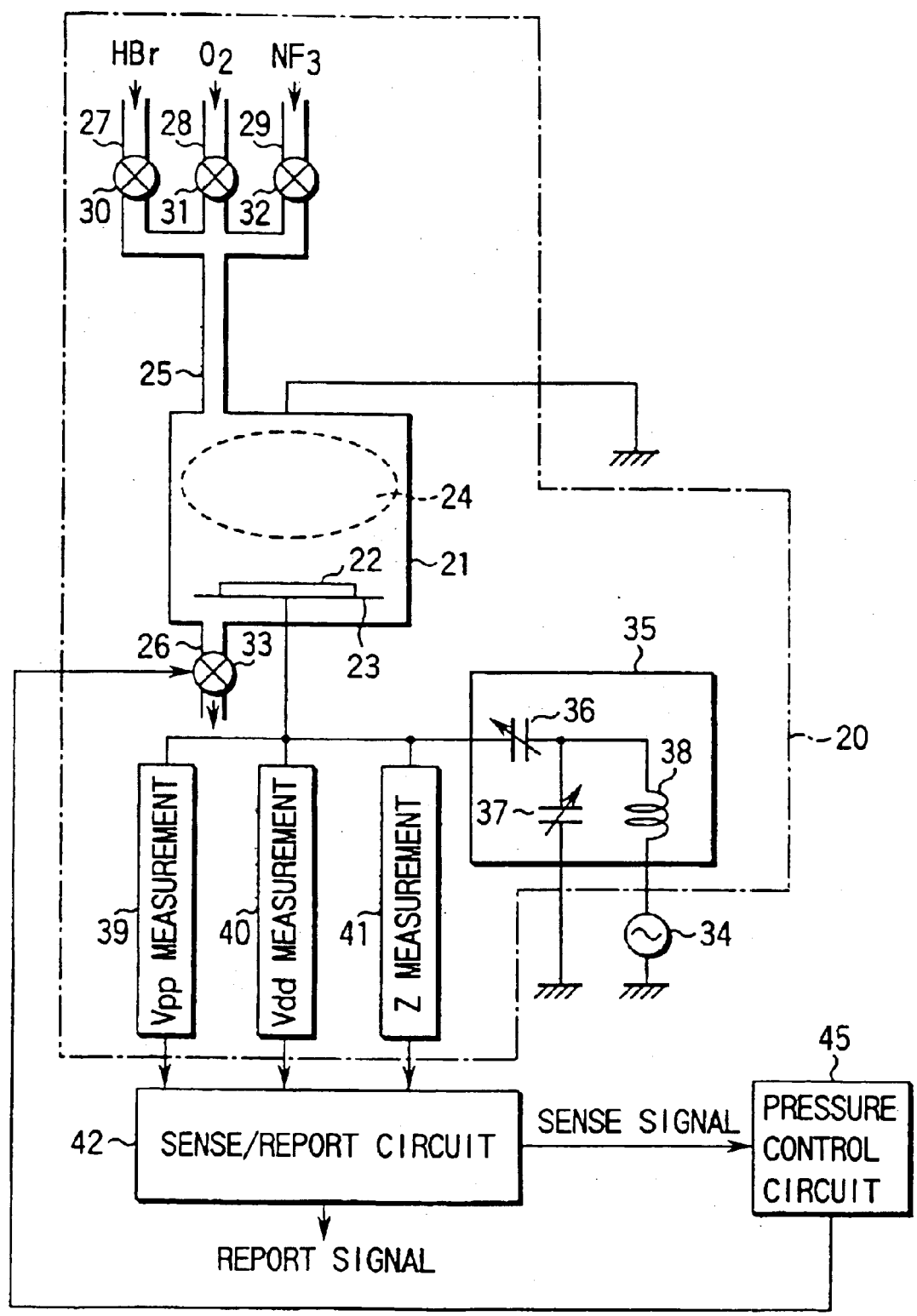
FIG. 10 is a schematic block diagram showing the configuration of an RIE system according to a fourth embodiment of the present invention and its peripheral circuit.

FIG. 10 shows a magnetron RIE system, a type of dry etching system according to a fourth embodiment of the present invention, and a control circuit for controlling the operation of the system.

The RIE system of the fourth embodiment differs from that of FIG. 1 in an additional pressure control circuit 45 that receives the sense signal outputted from the sense/report circuit 42 and controls the pressure in the vacuum reactive chamber by controlling the opening and closing of the electronic valve 33 provided at the outlet 26. The output of the pressure control circuit 45 is supplied to the valve 33.

After each lot processing of semiconductor substrates using the RIE system of the fourth embodiment, a sample of the substrate as shown in FIG. 1A was placed in the vacuum reactive chamber 21. Reactive gas was introduced into the vacuum reactive chamber 21. Then, the inside of the vacuum reactive chamber was kept at a specific pressure and the output of the high-frequency power supply 34 was applied, thereby generating discharging plasma 24, which causes reactive ions to etch the sample.

At that time, dry etching was done changing the pressure in the vacuum reactive chamber 21, thereby examining how the taper angle θ at the top of the trench as shown in FIG. 1A changed. The results are shown in TABLE 1 and FIG. 11.

TABLE 1

| PRESSURE (mTorr) | TAPER ANGLE θ (°) |
| --- | --- |
| 100 | 88.42 |
| 150 | 88.17 |
| 200 | 88.09 |

Figure 11:
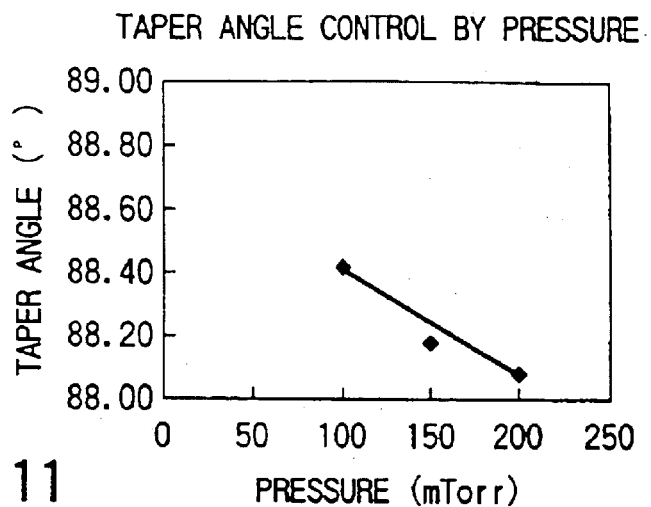
FIG. 11 shows the relationship between the pressure in the vacuum reactive chamber and the taper angle θ at the top of the trench in the system of FIG. 10.

It can be seen from TABLE 1 and FIG. 11 that as the pressure in the vacuum reactive chamber 21 decreases, the taper angle θ increases. The reason is considered as follows. As the pressure in the vacuum reactive chamber decreases, ions begin to have the same direction and the frequency of collision between ions or between ions and other particles, such as atoms, decreases. As a result, because the kinetic energy accelerated by an electric field is not lost because of collisions, the energy at which ions arrive at the substrate increases, which produces the effect of scraping the sidewall protective film easily as when the output of the high-frequency power supply 34 is increased.

Therefore, the taper angle θ can be controlled to a desired value by inputting the sense signal from the sense/report circuit 42 to the pressure control circuit 45, adjusting the amount of exhaust from the vacuum reactive chamber 21 by controlling the opening and closing of the valve 33 according to the output of the pressure control circuit 45, thereby adjusting and keeping the pressure in the vacuum reactive chamber 21 at a desired constant value.

Figure 12:
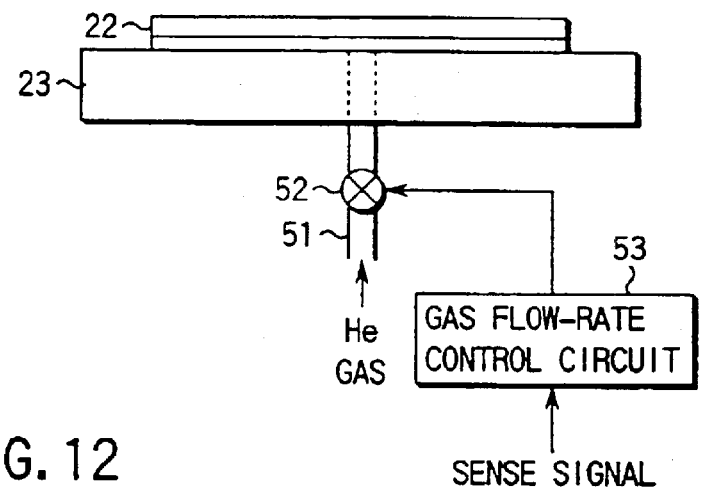
FIG. 12 is a schematic block diagram showing the configuration of an RIE system according to a fifth embodiment of the present invention and its peripheral circuit.

FIG. 12 shows a magnetron RIE system, a type of dry etching system according to a fifth embodiment of the present invention, and a control circuit for controlling the operation of the system.

In the RIE system of the fifth embodiment, a cooling gas intake 51 is provided on the reverse side of the cathode electrode 23, or on the opposite side to the surface on which a substrate 22 to be processed is placed. A cooling gas, such as He gas, is introduced through the intake 51. The cooling gas introduced through the intake 51 erupts from the surface of the cathode electrode 23 on which the substrate 22 is placed, thereby cooling the substrate 22.

Furthermore, an electronic valve 52 for adjusting the flow rate of the cooling gas introduced through the intake 51 is provided at the cooling gas intake 51. The opening and closing of the valve 52 is controlled according to the output of the gas flow-rate control circuit 53 that receives the sense signal outputted from the sense/report circuit 42. In general, the inside of the vacuum reactive chamber 21 where discharging plasma is being generated is as high as about 120° C. The substrate 22 in the chamber is also at about the same temperature. When a cooling gas, such as He gas, is erupted toward the back of the substrate 22, the temperature of the substrate 22 is adjusted according to the flow rate of the cooling gas.

After each lot processing of semiconductor substrates using the RIE system of the fifth embodiment, a sample of the substrate as shown in FIG. 1A was placed in the vacuum reactive chamber 21. Reactive gas was introduced into the vacuum reactive chamber 21. Then, the vacuum reactive chamber was kept at a specific pressure and the cooling gas was introduced through the valve 52, thereby lowering the temperature of the substrate 22 to a specific temperature. Thereafter, the output of the high-frequency power supply 34 was applied to the cathode electrode 23, thereby generating discharging plasma 24, which causes reactive ions to etch the sample.

At that time, dry etching was done changing the temperature of the substrate 22, thereby examining how the taper angle θ at the top of the trench as shown in FIG. 1B changed. The results are shown in TABLE 2 and FIG. 13. The flow rate (pressure) of the cooling gas is shown as the values related to the temperature.

TABLE 2

| PRESSURE (Torr) | TAPER ANGLE θ (°) |
| --- | --- |
| 10 | 88.36 |
| 15 | 88.25 |
| 20 | 88.19 |

Figure 13:
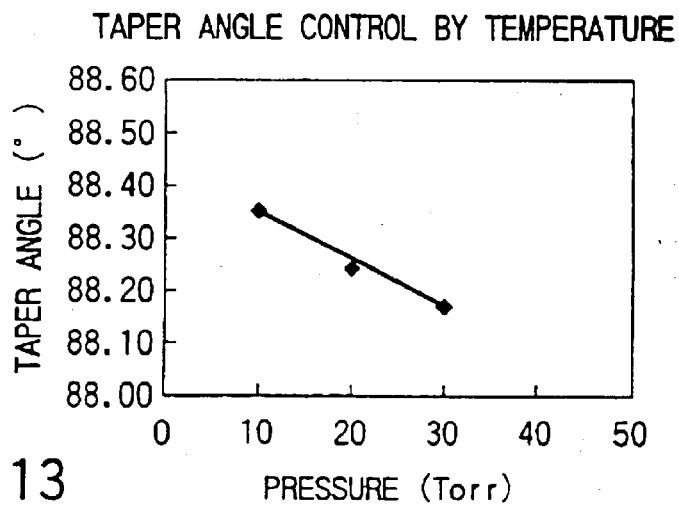
FIG. 13 shows the relationship between the pressure of a cooling gas to adjust the temperature of the substrate to be processed and the taper angle at the top of the trench in the system of FIG. 12.

It can be seen from TABLE 2 and FIG. 13 that, as the pressure of the cooling gas increases, the taper angle θ increases. The reason is considered as follows. As the pressure of the cooling gas is increased, the temperature of the substrate drops, increasing the amount of deposits of reaction products (sediment and sidewall protective films), which produces the effect of decreasing the taper angle θ as when the flow rate of $O_2$ gas is increased.

Therefore, the taper angle θ can be controlled to a desired value by adjusting and keeping the temperature of the substrate at a desired constant value.

As described above, with a semiconductor device manufacturing system according to the present invention, it is possible to externally grasp the change of the diameter of the trench bottom with time dependent on the number of substrates processed in processing, for example, a trench for trench capacitor and the condition of the inner surface and others of the vacuum reactive chamber, making it possible to determine the suitable cleaning time of the inside of the vacuum reactive chamber and control the processing of the shape of a substrate, which thereby suppresses the change with time.

Additional advantages and modifications will readily occur to those skilled in the art. Therefore, the invention in its broader aspects is not limited to the specific details and representative embodiments shown and described herein. Accordingly, various modifications may be without departing from the spirit or scope of the general inventive concept as defined by the appended claims and their equivalents.

What is claimed is:

1. A semiconductor device manufacturing system comprising:

a vacuum chamber provided with a cathode electrode for holding a substrate to be processed, a reactive gas intake, and a reactive gas outlet, and into which a reactive gas for generating discharging plasma by the application of a high-frequency electric power is introduced through said intake;

a high-frequency power supply connected to the cathode electrode, for applying a high-frequency electric power to the cathode electrode;

an electronic valve provided at the outlet that the pressure in the vacuum chamber is adjusted;

a measuring circuit connected to the cathode electrode for measuring at least one of the impedance of a system including the plasma, the peak-to-peak voltage of a high-frequency signal applied to the plasma, and a self-bias voltage applied to the cathode electrode; and a control circuit configured to receive the measured value from the measuring circuit, the control circuit supplies an output based on the measured value to the valve, and controls the operation of the valve in such a manner that the measured value of the measuring circuit is kept at a specific value.

2. The system according to claim 1, wherein the reactive gas is an etching gas for etching the substrate to be processed.

3. The system according to claim 1, further comprising an impedance matching circuit provided between the high-frequency power supply and the cathode electrode of the vacuum chamber for effecting the impedance matching between the output of the high-frequency power supply and a load on the high-frequency power supply.

* * * * *